United States Patent
Lo et al.

[11] Patent Number: 6,052,024
[45] Date of Patent: Apr. 18, 2000

[54] MONOLITHIC, LOW-NOISE, SYNCHRONOUS DIRECT DETECTION RECEIVER FOR PASSIVE MICROWAVE/MILLIMETER-WAVE RADIOMETRIC IMAGING SYSTEMS

[75] Inventors: Chung-Wen Dennis Lo, Foster City; Barry R. Allen, Redondo Beach; Eric W. Lin; Gee Samuel Dow, both of Rancho Palos Verdes; Paul Shu Chung Lee, La Palma, all of Calif.

[73] Assignee: TRW Inc., Redondo Beach, Calif.

[21] Appl. No.: 08/947,525

[22] Filed: Aug. 26, 1997

Related U.S. Application Data

[62] Division of application No. 08/696,451, Aug. 13, 1996, Pat. No. 5,815,113.

[51] Int. Cl.[7] .................................. H03F 3/60; H03F 3/68
[52] U.S. Cl. .................................. 330/53; 330/124 R
[58] Field of Search .................................. 332/53, 124 R, 332/286, 295

[56] References Cited

U.S. PATENT DOCUMENTS

| | | |
|---|---|---|
| H646 | 6/1989 | Tsui . |
| 4,429,417 | 1/1984 | Yool . |
| 4,538,153 | 8/1985 | Taga . |
| 4,557,272 | 12/1985 | Carr . |
| 4,627,442 | 12/1986 | Land . |
| 4,673,298 | 6/1987 | Hunter et al. . |
| 4,724,439 | 2/1988 | Wiley et al. . |
| 4,771,247 | 9/1988 | Jacomb-Hood . |
| 5,036,289 | 7/1991 | Duran . |
| 5,119,042 | 6/1992 | Crampton et al. ............ 330/295 |
| 5,121,124 | 6/1992 | Spivey et al. . |
| 5,136,300 | 8/1992 | Clarke et al. . |
| 5,149,198 | 9/1992 | Sterzer . |
| 5,166,639 | 11/1992 | Green et al. . |
| 5,198,776 | 3/1993 | Carr . |
| 5,202,692 | 4/1993 | Huguenin et al. . |
| 5,218,357 | 6/1993 | Sukamto et al. . |
| 5,227,800 | 7/1993 | Huguenin et al. . |
| 5,231,404 | 7/1993 | Gasiewski . |
| 5,272,485 | 12/1993 | Mason et al. . |
| 5,273,102 | 12/1993 | Lillquist et al. . |
| 5,404,581 | 4/1995 | Honjo . |
| 5,438,336 | 8/1995 | Lee et al. . |
| 5,606,283 | 2/1997 | Allen et al. ............ 330/124 R |

OTHER PUBLICATIONS

Lo et al., "A Monolithic W–band Seven–stage Low Noise Amplifier/Detector for Radiometric Imaging Application," pp. 1–11.

*Primary Examiner*—Steven J. Mottola
*Attorney, Agent, or Firm*—Michael S. Yatsko

[57] ABSTRACT

A direct detection receiver for a passive microwave and millimeter wave radiometric imaging system. The receiver includes a balanced switch low-noise amplifier (BSLNA). A front-end, low-noise amplifier (LNA) is inserted before the BSLNA to achieve a low-noise figure, as well as provide sufficient gain to minimize the input noise figure degradation due to loss of the BSLNA. A high-electron mobility transistor (HEMT) diode is used as a power detector. The front-end amplifier, BSLNA and diode are process compatible for monolithic integration.

6 Claims, 1 Drawing Sheet

MONOLITHIC, LOW-NOISE, SYNCHRONOUS DIRECT DETECTION RECEIVER FOR PASSIVE MICROWAVE/MILLIMETER-WAVE RADIOMETRIC IMAGING SYSTEMS

CROSS-REFERENCE TO RELATED APPLICATIONS

This is a divisional of U.S. patent application Ser. No. 08/696,451, filed Aug. 13, 1996 and now U.S. Pat. No. 5,815,113.

This application is related to patent application Ser. No. 08/440,555, filed on May 12, 1995, and now U.S. Pat. No. 5,606,283 assigned to the same assignee as the assignee of the present invention.

BACKGROUND OF THE INVENTION

1. Field of the Invention p The present invention relates to a monolithic, low-noise, synchronous direct detection receiver for passive microwave and millimeter wave radiometric imaging systems, and more particularly to a balanced switched low-noise amplifier (BSLNA) with a front end low-noise amplifier (LNA) to achieve a low-noise figure and provides sufficient gain to minimize the input noise figure degradation due to losses in the switched amplifier circuit, which can be monolithically integrated with a high-electron mobility transistor (HEMT) diode to form a direct detection receiver suitable for use in focal plane array imaging systems.

2. Description of the Prior Art

Radiometric imaging systems are generally known in the art. An example of such a system is disclosed in U.S. Pat. No. 5,438,336, assigned to the same assignee as the assignee of the present invention and hereby incorporated by reference. Such radiometric imaging systems are passive imaging systems, used to sense microwave and millimeter wave radiation, for example thermal radiation, in a field of view known as a focal plane imaging array. The sensed radiation is converted to an output signal to form an image of the object emitting the radiation. Since microwave and millimeter wave radiation is only attenuated to a limited degree by environmental obstacles, such as a fog, haze, light rain, dust and smoke, such imaging systems are useful in various commercial and military applications. For example, as disclosed in U.S. Pat. No. 5,202,692, such radiometric imaging systems are known to be used, for example for aircraft navigation. Such imaging systems are also known to be used to assist aircraft in landing during a low-visibility condition and also would be useful in assisting harbor and channel navigation for ships in fog and various other low-visibility conditions. Such systems are also used to provide images of battle targets during low-visibility conditions, as well as various other applications as generally disclosed in U.S. Pat. No. 5,198,776.

Such radiometric imaging systems are known to utilize different types of receivers to detect the microwave and millimeter radiation. For example, both direct detection receivers, as well as heterodyne-type receivers, are known. For example, FIGS. 4 and 5 of U.S. Pat. No. 5,202,692 illustrate known heterodyne-type receivers used with radiometric imaging systems. Unfortunately, such heterodyne receivers require a local oscillator, which increases the number of hardware components of the receiver and also adds to the total power requirement. In addition, local oscillators are known to be relatively bulky, which make them generally unsuitable for monolithic integration.

As such, direct detection receivers are known to be used that obviate the need for a local oscillator. An example of such a direct detection receiver is disclosed in U.S. Pat. No. 4,557,272. That system utilizes a so-called Dicke switch for comparing the radiation from the unknown source with a reference signal. The Dicke switch serves to switch the receiver input from the antennae receiving the electromagnetic radiation from the unknown source and the known source at a constant rate. The switched or modulated signal is then amplified and detected. Dicke switches are discussed in detail in "The Measurement of Thermal Radiation at Microwave Frequencies," by R. H. Dicke, *The Review of Scientific Instruments*, Vol. 17, No. 7, July 1946. Direct detection receivers that utilize Dicke switches are not suitable for monolithic integration. Other drawbacks of direct-detection receivers utilizing such Dicke switches are generally discussed in U.S. Pat. No. 5,149,198.

Direct detection receivers for radiometric imaging systems that utilize so-called Dicke switch replacements are also known. An example of such a system is disclosed in U.S. Pat. No. 5,149,198. The so-called Dicke switch replacement disclosed in the '198 patent includes a pair of hybrid rings defining a pair of input ports and a pair of output ports. The input ports are adapted to be coupled to the source of radiation to be detected, as well as to a reference source. Two parallel paths are formed between the input port and the output port. In one path, a pair of amplifiers is coupled to a 0–180° phase-shift switch, which, in turn, is connected to an output port. In the alternative path, two amplifiers are connected between the input port and the output port. One advantage of the Dicke switch replacement illustrated in the '198 patent is that the signal is amplified prior to being switched, thus improving the signal-to-noise ratio of the radiometer. However, with such a configuration, the loss contribution of the hybrid ring is relatively significant, which tends to degrade the receiver temperature sensitivity.

SUMMARY OF THE INVENTION

It is an object of the present invention to solve various problems in the prior art.

It is yet a further object of the present invention to provide a direct detection receiver that is adapted to be monolithically integrated.

It is yet another object of the present invention to provide a direct detection receiver for a radiometric imaging system with enhanced system noise performance.

Briefly, the present invention relates to a direct detection receiver for a passive microwave and millimeter wave radiometric imaging system. The receiver includes a balanced switch low-noise amplifier (BSLNA). A front-end, low-noise amplifier (LNA) is inserted before the BSLNA to achieve a low-noise figure, as well as provide sufficient gain to minimize the input noise figure degradation due to loss of the BSLNA. A high-electron mobility transistor (HEMT) diode is used as a power detector. The front-end amplifier, BSLNA and diode are process compatible for monolithic integration.

BRIEF DESCRIPTION OF THE DRAWING

These and other objects of the present invention will be readily understood with respect to the following specification and attached drawing, wherein.

DETAILED DESCRIPTION OF THE INVENTION

Figure 1:
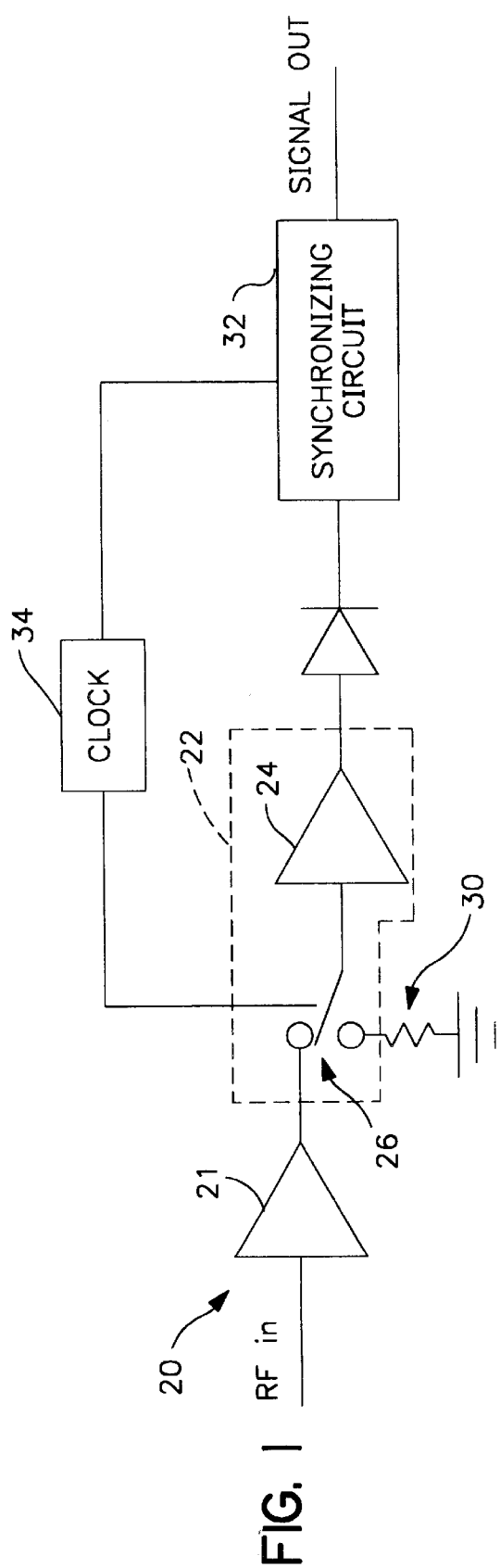
FIG. 1 is a block diagram of the direct detection receiver in accordance with the present invention.

Referring to FIG. 1, a block diagram of the direct detection receiver in accordance with the present invention is illustrated. The direct detection receiver, generally identified with the reference numeral 20, includes a front-end, low-noise amplifier (LNA) 21, a balanced switched, low-noise, high-gain amplifier 22, which includes a low-noise amplifier 24 and a switch 26, shown as a double-pole, single-throw switch. The output of the front-end LNA 21 is connected to one pole of the switch 26. The other pole of the switch 26 is connected to a reference signal from an input impedance 30. The common pole of the switch 26 is connected to the amplifier 24. The output of the amplifier 28 is connected to a diode 30, used for power detection. The diode 30 may be implemented as a high-electron mobility transistor (HEMT) diode, which inherently has high 1/f noise, which facilitates monolithic integration of the receiver 20. The output of the diode 30 is connected to synchronizing circuit 32, which synchronizes the output signal with the switching of the switch 26 by way of a clock 34.

An important aspect of the invention is that the front-end LNA 21 provides sufficient gain to minimize the input noise figure degradation due to losses in the switched amplifier circuit (i.e. BSLNA 22). The BSLNA 22 is a high-gain amplifier that amplifies and modulates the incoming signal at an intermediate RF frequency in order to suppress the 1/f noise contribution of the power-detector diode 30. The modulated signal at the output of the BSLNA 22 (i.e. output of the amplifier 28) is applied to the power detector 30 and, in turn, to the synchronizing or demodulator circuit 32 to generate an output voltage corresponding to the input scene radiometric temperature.

Figure 2:
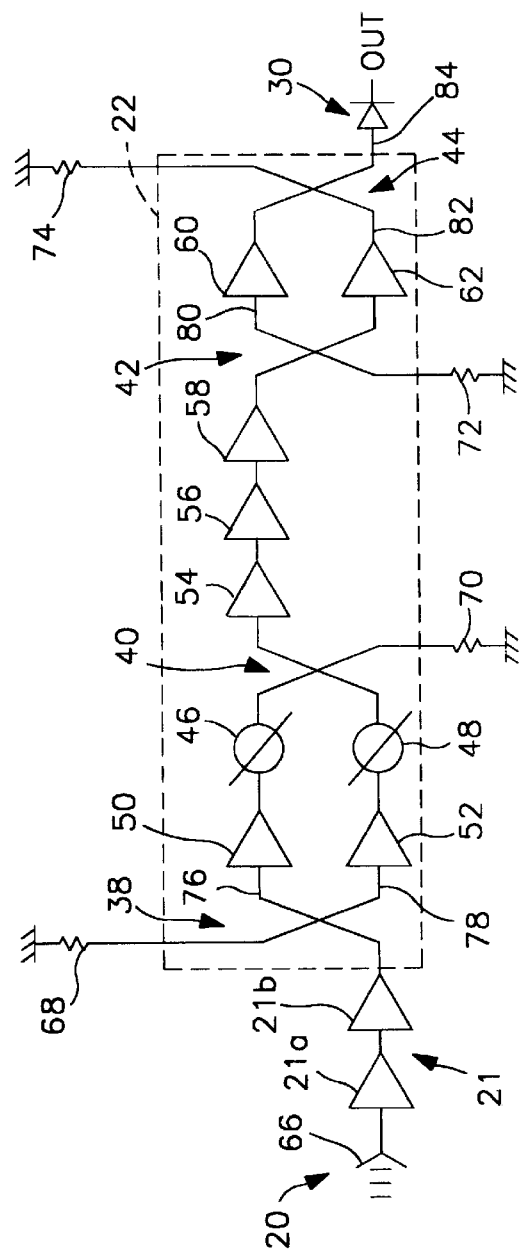
FIG. 2 is a block diagram of the direct detection in accordance with the present invention, implemented as a seven-stage switching low-noise amplifier and detector.

Referring to FIG. 2, the direct detection receiver 20 may be implemented as a monolithic seven-stage, low-noise amplifier detector that includes the BSLNA 22, shown within the dashed box, the front-end LNA 21, as well as the power detector diode 30. The BSLNA is implemented with four 3 db 90° hybrid couplers 38, 40, 42 and 44, two 0°–180° reflected phase shifters 46 and 48 and seven low-noise, high-gain amplifiers 50, 52, 54, 56, 58, 60 and 62. The LNA 21 is implemented as a two-stage amplifier, identified in FIG. 2 with the reference numerals 21a and 21b.

The millimeter-wave or microwave signal of interest is coupled to an input port 66, which, in turn, is coupled to the input of the front-end LNA 21a and 21b. The input port 36 is adapted to be connected to various types of antennae elements (not shown).

The hybrid couplers 38, 40, 42 and 44 can be Lange couplers or branch line couplers, as known to those skilled in the art. Various types of hybrid couplers of this type are described in detail in *Nonlinear Microwave Circuits*, by Steven A. Maas, Artech House, 1988, Ch. 5, pp. 209–230. A hybrid ring, for example as disclosed in U.S. Pat. No. 5,149,198, may also be used for the hybrid couplers 38, 40, 42 and 44. Each of the hybrid couplers 38, 40, 42 and 44 includes two input ports and two output ports as shown. One of the input ports for each of the hybrid couplers 38, 40, 42 and 44 is connected to a reference signal, for example impedance matched noise signal from the load resistors 68, 70, 72 and 74, respectively.

The hybrid coupler 38 couples the input signal from the input port 66 and the reference signal from the load resistor 68 into two parallel paths; a first path 76 and a second path 78. In particular, the hybrid coupler 38 applies the input signal from the input port 66 to the first path 76 in its original phase and applies the input signal to the other path 78 90° out of phase with the signal applied to the first path 76. Similarly, the reference signal from the load resistor 68 is separated into an in-phase signal that is applied along the path 78, along with the out-of-phase signal from the input port 66 and a signal that is 90° out of phase with the reference signal that is applied to the path 76 along with the in phase signal from the input 66.

Each of the paths 76 and 78 include a low-noise amplifier 50 and 52 and a 0°–180° reflected phase shifter 46 and 48, respectively. The phase shifters 46 and 48 include a 3 db 90° hybrid coupler that operates in the same manner as the hybrid coupler 38 described above. The phase shifters 46 and 48 also include switching devices (not shown), for example, as disclosed in detail in U.S. patent application Ser. No. 08/440,555, filed on May 12, 1995, and now U.S. Pat. No. 5,606,283 hereby incorporated by reference. The switching devices modulate the signals along the paths 76 and 78. In particular, by combining either the in-phase (0°) or out-of-phase (180°) signals in the two paths 76 and 78, a switching function is accomplished.

Control signals are applied to the switching devices to control the output of the phase shifters 46 and 48 as generally described in the above-mentioned patent application to switch or modulate the input signal from the input port 36 with the reference signal. Referring back to FIG. 1, the clock 34, for example, a 100 hertz square wave, is applied to the switching devices to control the switching action.

A second hybrid coupler 40 couples an output from the paths 76 and 78 and a reference signal from the input impedance 70 to the series of high-gain, low-noise buffer amplifiers 54, 56 and 58. The output of the buffer amplifiers 54, 56 and 58 are coupled to the coupler 42, along with a reference signal from the input resistance 72, forming two parallel paths, 80 and 82. Each of the parallel paths 80 and 82 includes a low-noise, high-gain amplifier 60 and 62, whose output, in turn, is coupled to the fourth coupler 44, along with the reference signal from the input resistance 74. The coupler 44 couples the signals from the paths 80 and 82 to an output port 84 and, in turn, to the diode detector 30, which converts the RF signals from the BSLNA 22 to comparable DC levels for signal processing.

The synchronizing circuit 32 synchronizes the signal processing from the diode detector 30 with the switching of the BSLNA 22. The synchronizing circuit provides synchronous detection of the detected output from the diode detector 30 as is commonly used for Dicke switched radiometers. The Dicke switched radiometer was first described by R. H. Dicke in "Measurement of Thermal Radiation at Microwave Frequencies," *The Review of Scientific Instruments*, Vol. 17, No. 7, July 1946, hereby incorporated by reference. The synchronizing circuit can be implemented in an analog or digital signal processor.

As described above, a unique and simple way to implement a synchronized and total power direct detection receiver for radiometric imaging is disclosed that is adapted to be integrated into a single microwave monolithic integrated circuit (MMIC). As discussed above, the diode 30 may be implemented as a HEMT diode that provides process compatibility for a monolithically integrated receiver. The inclusion of the low-noise amplifier 22 before the BSLNA 22 reduces the loss contribution of the couplers to the system noise and provides improvement in the receiver temperature sensitivity.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A switched amplifier circuit comprising:

an input port for receiving input signals;

a front-end, low-noise amplifier coupled to said input port for amplifying said input signals and providing amplified output signals;

a first coupling device coupled to said low-noise amplifier and developing two input paths, each input path including a phase shifter;

a second coupling device coupled to said phase shifters; said phase shifters adapted to receive a clock signal for clocking said phase shifters;

at least one buffer amplifier;

a third coupling device, said at least one buffer amplifier coupled between said second coupling device and said third coupling device, said third coupling device developing two output paths, each output path including at least one buffer amplifier; and a fourth coupler for coupling said out paths to an output port.

2. A switched amplifier circuit as recited in claim 1, wherein said first, second, third and fourth coupling devices are hybrid coupling devices.

3. A switched amplifier circuit as recited in claim 1, wherein said first, second, third and fourth coupling devices are Lange coupling devices.

4. A switched amplifier circuit as recited in claim 1, further including a diode, coupled to said output port forming a direct detection receiver.

5. A switched amplifier circuit as recited in claim 4, wherein said diode is formed as a HEMT diode.

6. A switched amplifier circuit as recited in claim 4, wherein said switched amplifier circuit, said diode and said front-end amplifier are process compatible with monolithic integration.

* * * * *